United States Patent [19]

Miller

[11] Patent Number: 4,621,205
[45] Date of Patent: Nov. 4, 1986

[54] METHOD AND APPARATUS FOR REDUCING VARACTOR NOISE

[75] Inventor: Brian M. Miller, Spokane, Wash.

[73] Assignee: Hewlett-Packard Company, Palo Alto, Calif.

[21] Appl. No.: 571,974

[22] Filed: Jan. 16, 1984

[51] Int. Cl.⁴ .............................................. H03K 3/26
[52] U.S. Cl. .................................. 307/320; 307/317 R
[58] Field of Search ................. 307/320, 317 R, 542, 307/219; 357/14; 328/165

[56] References Cited

U.S. PATENT DOCUMENTS 3,521,244  7/1970  Weimer ................................. 357/14
3,761,900  9/1973  Kasperkovitz ....................... 307/320
3,794,942  2/1974  Blankenburg ....................... 307/320

OTHER PUBLICATIONS

Jonkuhn et al., "Matched-Varactor Chip Brings Electronic Tuning to A-M Radios", Electronics, 7/71, pp. 60–65.

Primary Examiner—John S. Heyman
Assistant Examiner—Timothy P. Callahan
Attorney, Agent, or Firm—Leslie G. Murray

[57] ABSTRACT

The deliberate use of multiple, seemingly redundant, varactor diodes to reduce noise in applications where a single varactor diode would otherwise be adequate.

8 Claims, 2 Drawing Figures

METHOD AND APPARATUS FOR REDUCING VARACTOR NOISE

BACKGROUND AND SUMMARY OF THE INVENTION

A varactor diode is a semiconductor device having voltage sensitive capacitance. It operates as a typical reverse biased diode. The capacitance of the device is primarily a function of the junction cross-sectional area and the length of the depletion region at the junction. The applied voltage (bias) determines the length of the depletion region and thus the capacitance.

The depletion region length is also a function of semiconductor doping. In an ideal diode, dopant concentration and distribution is fixed. However, in real diodes, dopant concentration and distribution is affected by surface states which varies the charge configuration of the diode. In addition, surface states are unstable and fluctuate with time. Thus, surface states are said to be "noisy".

Since surface states modify the dopant profile, the depletion region length, and therefore diode capacitance, is affected. The time-dependence of surface states introduce the same dependence into the depletion region length and related diode capacitance. Thus, the diode capacitance becomes noisy.

Referring now to FIG. 1, for a given reverse bias, varactor 10 may be modeled as a fixed capacitor 12 in parallel with a small variable capacitor 14 having randomly changing capacitance (mean=0, variance=$\sigma^2$). Thus, $$|C_{14}| << C_{12}$$

Obviously, in tuned circuits using varactor diode tuning $C_{14}$ modulates the resonant frequency. In oscillator designs, $C_{14}$ is often the dominant phase noise mechanism at off-set frequencies close to the carrier.

The present invention employs an array of several—even many—varactors. Other, well known applications have used several varactors, but not in the same way or for the same reason. Where multiple, series-connected varactors are used in voltage controlled oscillator (VCO) circuits for preventing breakdown, the RF voltage across any one diode is reduced and reduces the likelihood of failure of a single varactor. Multiple varactors are also used to lower frequency modulation distortion; for example, odd-order frequency modulation distortion can be reduced by using a number of varactors in series. Finally, several varactors are often connected in parallel in a given circuit to increase capacitance without affecting other characteristics associated with a single varactor in the same circuit. None of these prior uses are shown nor suggested to improve the inherent noise characteristics of the circuit.

Prior to development of the present invention, varactor-induced noise in a VCO was tolerated, reduced by decoupling the varactors from the circuit or employing a phase-lock loop. Decoupling the varactors decreases the oscillator tuning range and, depending on the application, may force the designer to use several VCO's where only one is actually necessary. If a phase-lock loop is employed, VCO tuning is also impaired and substantial additional circuitry is required.

In accordance with the principles of the present invention, in any application sensitive to varactor noise, an array of varactor diodes may be used in place of the single, otherwise adequate, varactor. The diodes are arranged in series-connected blocks of parallel-connected diodes. Obviously, the capacitance and biasing of each diode can be computed to provide the equivalent capacitance required for the particular application. However, an improvement in noise performance approximately equivalent to the square root of the number of diodes used in the array is achieved.

DESCRIPTION OF THE PREFERRED EMBODIMENT

Figure 2:
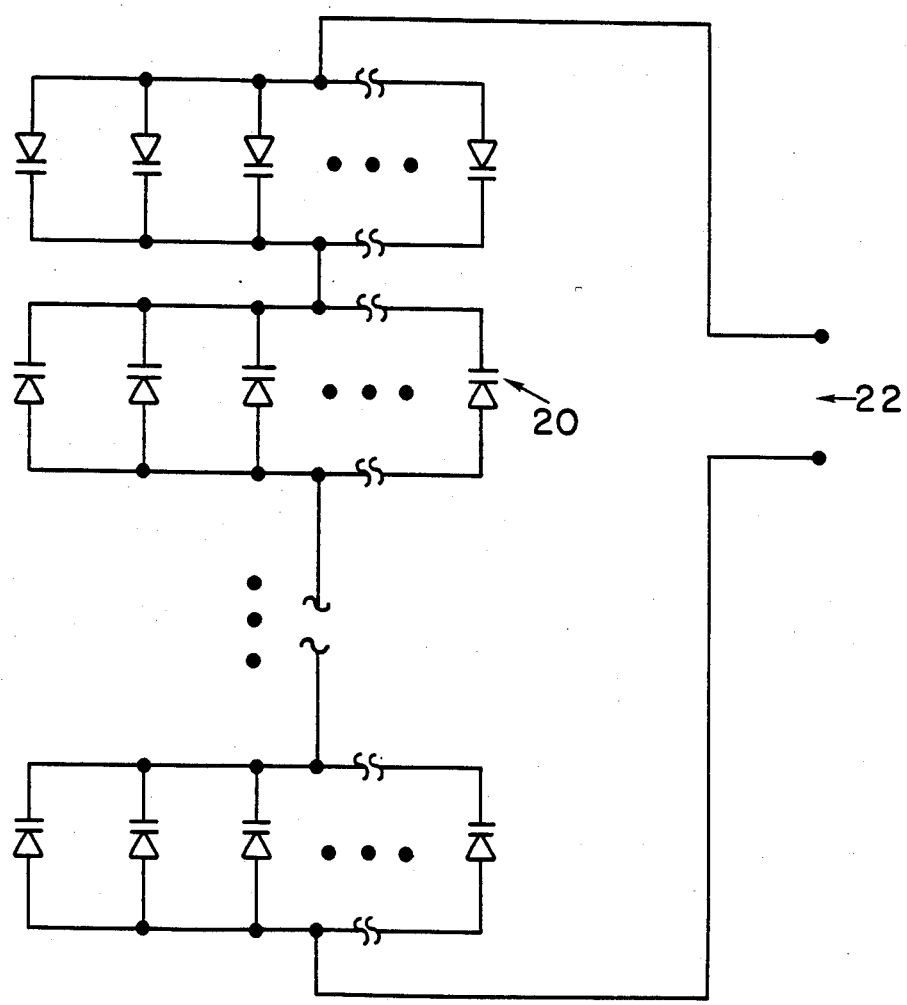
FIG. 2 is a typical array of semiconductor devices of FIG. 1 arranged in accordance with the principles of the present invention.

An array of varactors having substantially identical electrical characteristics, see for example at 20, is shown in FIG. 2. The array comprises "K" number of varactors in "K" number of rows to provide a total capacitance $C_T$ at output 22. While biasing of varactors 20 is not shown, the bias on a varactor diode controls the magnitude of the capacitance of the varactor diode and, once biased, the varactor diode acts as a capacitor. The varactor diodes 20 may be connected in any configuration (such as the configuration shown in FIG. 2) desired to take maximum advantage of a particular biasing arrangement without affecting the operation of the individual varactor diodes 20 within the array. For this "symmetrical" array, i.e. K×K, $C_T$ will be approximately equal in value to any one of the varactors. $C_T$ can be adjusted to any desired value, but the array necessarily will be asymmetric.

If each varactor 20 is represented by its rectangular coordinate position in the array, then $C_T$ is given by:

$$C_{TOT} = \cfrac{1}{\left(\cfrac{1}{\sum\limits_{j=1}^{K} C_{1,j}} + \cfrac{1}{\sum\limits_{j=1}^{K} C_{2,j}} + \ldots + \cfrac{1}{\sum\limits_{j=1}^{K} C_{k,j}}\right)} ; \quad (A)$$

The position of any particular varactor in the array is unimportant, since all varactors irrespective of position contribute equally to $C_T$. Consequently, the sensitivity of $C_T$ to changes in any one of the varactors is the same for such changes in any of the other varactors. Equations (B) through (M) (Table 1) show that the present invention reduces varactor-induced noise by the square root of the number of varactors used.

Figure 1:
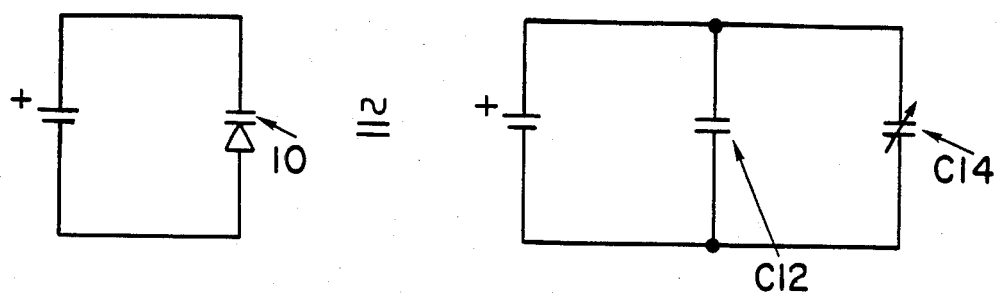
FIG. 1 is an equivalent circuit of the semiconductor device used in the present invention.

As stated earlier in this specification, the noise component of each varactor, designated $C_{14}$ in FIG. 1, is independent from all other varactors in the array. Another analysis of the noise contribution of each varactor to the entire array begins by summing the square of each noise component which gives the square of the total noise component as shown in equation (M). Each varactor has a variance of $\sigma^2$. Equation (M) shows that, in an array of K×K varactors, each with a mean $C_{av}$ ($C_{12}$ of FIG. 1) and noise variance equal to $\sigma^2$, the equivalent mean capacitance is $C_{av}$, and the noise variance is $\sigma^2/K^2$. Thus, noise power has been reduced by a factor of $K^2$, and noise voltage by $\sqrt{K^2}$.

The present invention exploits the fact that varactor diode noise adds incoherently while varactor capacitance adds coherently. Thus, where other parameters of the application permit, the use of series-connected blocks of parallel-connected varactors in an array such as shown in FIG. 2 can significantly reduce noise.

As stated earlier in this specification, a varactor configuration constructed according to the principles of the present invention is not limited to a symmetrical array. In asymmetrical arrays, the average capacitance is not approximated by $C_{av}$ and the noise improvement may be less than the square root of the number of varactors used.

The varactor array of the present invention may incorporate varactors having substantially different electrical characteristics, which may enhance the noise improvement of the present invention. Each such varactor may be biased approximately the same as the others in the array or individually different. Individually different biasing of the varactors in the configuration of FIG. 2 is also possible. Every such mixed varactor/mixed biasing array is a special case and must be examined separately using the following equation:

$$(C_{TOTnoise})^2 = \sum_{i=1}^{K} \sum_{j=1}^{N} (C_{i,jnoise} \cdot S_{C_{TOT}}^{C_{i,j}})^2 \quad (N)$$

where $K$ may, or may not, $= N$.

TABLE 1

$$S_{C_{TOT}}^{C_{1,1}} = \frac{dC_{TOT}}{dC_{1,1}} \cdot \frac{C_{1,1}}{C_{TOT}} \quad (B)$$

$$\overline{C_{TOT}} = \quad (C)$$

$$\frac{1}{\left(\frac{1}{KC_{av}} + \frac{1}{KC_{av}} + \ldots + \frac{1}{KC_{av}}\right)} = \frac{1}{\left(\frac{K}{KC_{av}}\right)} = C_{av}$$

$$\overline{C_{1,1}} = C_{av} \quad (D)$$

$$S_{C_{TOT}}^{C_{1,1}} = \frac{dC_{TOT}}{dC_{1,1}} \text{ where } S = \text{sensitivity of } C_{TOT} \text{ to } C_{1,1} \quad (E)$$

$$\frac{dC_{TOT}}{dC_{1,1}} = \quad (F)$$

$$\frac{(-1)}{\left(\frac{1}{\sum_{j=1}^{K} C_{1,j}} + \frac{1}{\sum_{j=1}^{K} C_{2,j}} + \ldots + \frac{1}{\sum_{j=1}^{K} C_{k,j}}\right)^2} \cdot \frac{(-1)}{\left(\sum_{j=1}^{K} C_{i,j}\right)^2}$$

$$C_{1,j} = C_{av} \quad (G)$$

-continued
TABLE 1

$$\frac{dC_{TOT}}{dC_{1,1}} = \frac{(-1)}{\left(\frac{K}{KC_{av}}\right)^2} \cdot \frac{(-1)}{\left(\frac{K}{KC_{av}}\right)^2} = \frac{1}{K^2} \quad (H)$$

$$S_{C_{TOT}}^{C_{1,1}} = \frac{1}{K^2} \quad (I)$$

$$(C_{TOTnoise\ components})^2 = (C_{1,1noise} \cdot S_{C_{TOT}}^{C_{1,1}})^2 + \quad (J)$$
$$(C_{1,2noise} \cdot S_{C_{TOT}}^{C_{1,2}})^2 + \ldots + (C_{K,Knoise} \cdot S_{C_{TOT}}^{C_{K,K}})^2$$

$$(C_{TOTnoise})^2 = \sum_{i=1}^{K} \sum_{j=1}^{K} (C_{i,jnoise} \cdot S_{C_{TOT}}^{C_{i,j}})^2 \quad (K)$$

$$= K^2 \left(\sigma \cdot \frac{1}{K^2}\right)^2 = \frac{\sigma^2}{K^2} \quad (L)$$

$$C_{TOTnoise} = \frac{\sqrt{\sigma^2}}{K^2} = \frac{\sigma}{K} \quad (M)$$

I claim:

1. Apparatus for reducing varactor diode-induced noise in electronic circuits, said apparatus comprising an array of series-conducted blocks of parallel-connected varactor diodes, said array of varactor diodes having a total capacitance equivalent to the capacitance of one such such varactor diode.

2. Apparatus as in claim 1 wherein said varactor diodes have substantially identical electrical characteristics.

3. Apparatus as in claim 2 wherein said varactor diodes are biased at substantially the same voltage.

4. Apparatus as in claim 3 wherein said array of varactor diodes comprises an array of K rows and K columns of varactor diodes, where K is an integer greater than 1 said array having the varactor diode-induced noise reduced by a factor of approximately the square root of the number of varactor diodes in the array.

5. A method for reducing varactor diode-induced noise in electronic circuits, said method comprising the steps of connecting a plurality of varactor diodes in parallel to form a block, and connecting a plurality of said blocks in series to form an array, wherein said array of varactor diodes having a total capacitance equivalent to the capacitance of one such varactor diode.

6. The method of claim 5 wherein said varactor diodes have substantially identical electrical characteristics.

7. The method of claim 6 further including the step of biasing each of the varactor diodes at substantially the same voltage.

8. The method of claim 7 wherein said array comprises K rows and K columns of varactor diodes where K is an integer greater than 1.

* * * * *